US009787924B2

(12) United States Patent
Tezuka

(10) Patent No.: US 9,787,924 B2
(45) Date of Patent: Oct. 10, 2017

(54) IMAGE SENSOR DEVICE, IMAGE PROCESSING DEVICE AND METHOD FOR MANUFACTURING IMAGE SENSOR DEVICE

(71) Applicant: KABUSHIKI KAISHA TOSHIBA, Tokyo (JP)

(72) Inventor: Tsutomu Tezuka, Ibaraki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 14/959,290

(22) Filed: Dec. 4, 2015

(65) Prior Publication Data
US 2016/0088253 A1 Mar. 24, 2016

Related U.S. Application Data

(63) Continuation of application No. PCT/JP2014/050921, filed on Jan. 20, 2014.

(30) Foreign Application Priority Data

Jun. 5, 2013 (JP) ................................. 2013-118789

(51) Int. Cl.
*H01L 27/14* (2006.01)
*H04N 5/3745* (2011.01)
(Continued)

(52) U.S. Cl.
CPC ..... *H04N 5/37455* (2013.01); *H01L 27/1464* (2013.01); *H01L 27/1469* (2013.01);
(Continued)

(58) Field of Classification Search
CPC .......................... H04N 5/37455; H04N 5/369; H01L 27/1469; H01L 27/14685; H01L 27/14627;
(Continued)

(56) References Cited

U.S. PATENT DOCUMENTS 8,946,610 B2   2/2015  Iwabuchi et al.
2005/0205930 A1  9/2005  Williams, Jr.
(Continued)

FOREIGN PATENT DOCUMENTS

JP   2000-353810   12/2000
JP   2006-156972    6/2006
(Continued)

OTHER PUBLICATIONS

Motoyoshi et al., "3D-LSI technology for image sensor," Pixel 2008 International Workshop, IOP Publishing (Sep. 23-26, 2008), cover page and pp. 1-12.
(Continued)

*Primary Examiner* — Tony Ko
(74) *Attorney, Agent, or Firm* — Finnegan, Henderson, Farabow, Garrett & Dunner, L.L.P.

(57) ABSTRACT

According to one embodiment, an image sensor device includes a sensor array on a semiconductor substrate, the sensor array including blocks, each of the blocks including a pixel and outputting a signal of the pixel; a first insulating layer on the sensor array; semiconductor layers on the first insulating layer; analog-digital converting circuits on the semiconductor layers, the analog-digital converting circuits corresponding to the blocks and processing the signal; a second insulating layer on the first insulating layer and the analog-digital converting circuits; and interconnect portions electrically connecting the analog-digital converting circuits to the blocks via a region between the semiconductor layers, the interconnect portions extending across the first insulating layer and the second insulating layer.

20 Claims, 7 Drawing Sheets

(51) Int. Cl.
*H04N 5/369* (2011.01)
*H01L 27/146* (2006.01)

(52) U.S. Cl.
CPC .. *H01L 27/14612* (2013.01); *H01L 27/14627* (2013.01); *H01L 27/14634* (2013.01); *H01L 27/14636* (2013.01); *H01L 27/14641* (2013.01); *H01L 27/14643* (2013.01); *H01L 27/14685* (2013.01); *H01L 27/14689* (2013.01); *H04N 5/369* (2013.01)

(58) Field of Classification Search
CPC ......... H01L 27/14641; H01L 27/14643; H01L 27/14689; H01L 27/14636; H01L 27/14634; H01L 27/1464; H01L 27/14612
See application file for complete search history.

(56) References Cited

U.S. PATENT DOCUMENTS

| | | | | |
|---|---|---|---|---|
| 2010/0276572 A1* | 11/2010 | Iwabuchi | ............. | H04N 5/2253 250/208.1 |
| 2011/0156197 A1* | 6/2011 | Tivarus | ............. | H01L 27/14634 257/444 |
| 2012/0133001 A1* | 5/2012 | Tkaczyk | ................. | H01L 27/20 257/414 |
| 2014/0175592 A1 | 6/2014 | Iwabuchi et al. | | |

FOREIGN PATENT DOCUMENTS

| | | |
|---|---|---|
| JP | 2006-173351 | 6/2006 |
| JP | 2010-212668 | 9/2010 |
| JP | 2011-204797 | 10/2011 |
| JP | 2011-243862 | 12/2011 |
| TW | 201101476 A | 1/2011 |
| WO | WO 2006/129762 | 12/2006 |

OTHER PUBLICATIONS

Sukegawa et al., "A 1/4-inch 8Mpixel Back-Illuminated Stacked CMOS Image Sensor," 2013 IEEE International Solid-State Circuits Conference (2013), pp. 484-486.

International Preliminary Report on Patentability and Written Opinion issued by the International Bureau of WIPO dated Dec. 8, 2015, for International Application No. PCT/JP2014/050921.

Office Action in corresponding Taiwanese Application No. 103102929 dated Mar. 17, 2016.

English-language International Search Report from the Japanese Patent Office for International Application No. PCT/JP2014/050921, dated Mar. 18, 2014.

\* cited by examiner

IMAGE SENSOR DEVICE, IMAGE PROCESSING DEVICE AND METHOD FOR MANUFACTURING IMAGE SENSOR DEVICE

CROSS-REFERENCE TO RELATED APPLICATIONS

This application is a Continuation Application of PCT Application No. PCT/JP2014/050921, filed Jan. 20, 2014 and based upon and claiming the benefit of priority from Japanese Patent Application. No. 2013-118789, filed Jun. 5, 2013, the entire contents of all of which are incorporated herein by reference.

FIELD

Embodiments described herein relate generally to an image sensor device in which a CMOS image sensor and an AD converter are stacked, and a method for manufacturing the same.

BACKGROUND

In recent years, a technique has been presented in which a pixel portion of a CMOS image sensor (CIS) and an analog-digital converter (ADC) portion are manufactured as separate chips, the chips are stacked, and the stacked chips are connected to each other. For example, a pixel region of a. CIS is divided into small blocks of 16×16 dots. A chip including a plurality of ADC cells are manufactured as a chip separately from the CIS so that ADCs (ADC cells) corresponding to the respective blocks are arranged in a two-dimensional manner. The ADCs are connected to the respective blocks of the CIS by minute metal junctions. This technique enables an increase in the frame rate, because the technique reduces the number of pixels to be controlled by an ADC in comparison with the conventional column parallel system. In addition, the technique enables a reduction in the chip area of the entire device including the CIS, because the ADCs placed on the sides of the pixels in the conventional column parallel system are superimposed on the pixel region.

An example in which the CIS and the peripheral logic circuit are formed as one unitary piece has been reported. In the example, the pixel portion of the CIS and the peripheral logic circuit including the ADCs are formed as separate chips mutually separated from each other, the chips are bonded to each other in a vertical direction, and the chips are vertically and electrically connected to each other with TSVs. This technique improves the processing performance, because the technique enables the use of optimized processes and circuit configurations for the pixel portion and the logic portion.

It is very difficult to electrically connect chips in which the pixel portion of a CIS and a peripheral logic circuit are separately manufactured. Although microbumps are required to electrically connect an ADC chip with a CIS chip, the pitch of the microbumps is 5 µm or more. For this reason, miniaturization of the connection pitch is difficult, and limits exist for dealing with future increases in the number of pixels in a small-sized CIS. It also has the problem of high costs (thinning, dicing, alignment, and bonding) for bonding chips manufactured separately. The case of bonding a peripheral logic circuit chip to a CIS chip with TSVs also has a similar problem because the pitch of TSVs is 10 µm or more.

DETAILED DESCRIPTION

In general, according to one embodiment, an image sensor device includes a sensor array disposed on a semiconductor substrate, the sensor array including blocks, each of the blocks including at least one pixel and outputting a signal of the at least one pixel; a first insulating layer disposed on the sensor array; semiconductor layers disposed on the first insulating layer; analog-digital converting circuits disposed on the semiconductor layers, the analog-digital converting circuits corresponding to the blocks and processing the signal; a second insulating layer disposed on the first insulating layer and the analog-digital converting circuits; and interconnect portions electrically connecting the analog-digital converting circuits to the blocks via a region between the semiconductor layers, the interconnect portions extending across the first insulating layer and the second insulating layer.

Image sensor devices according to the embodiments will be explained hereinafter with reference to the drawings.

First Embodiment

Figure 1:
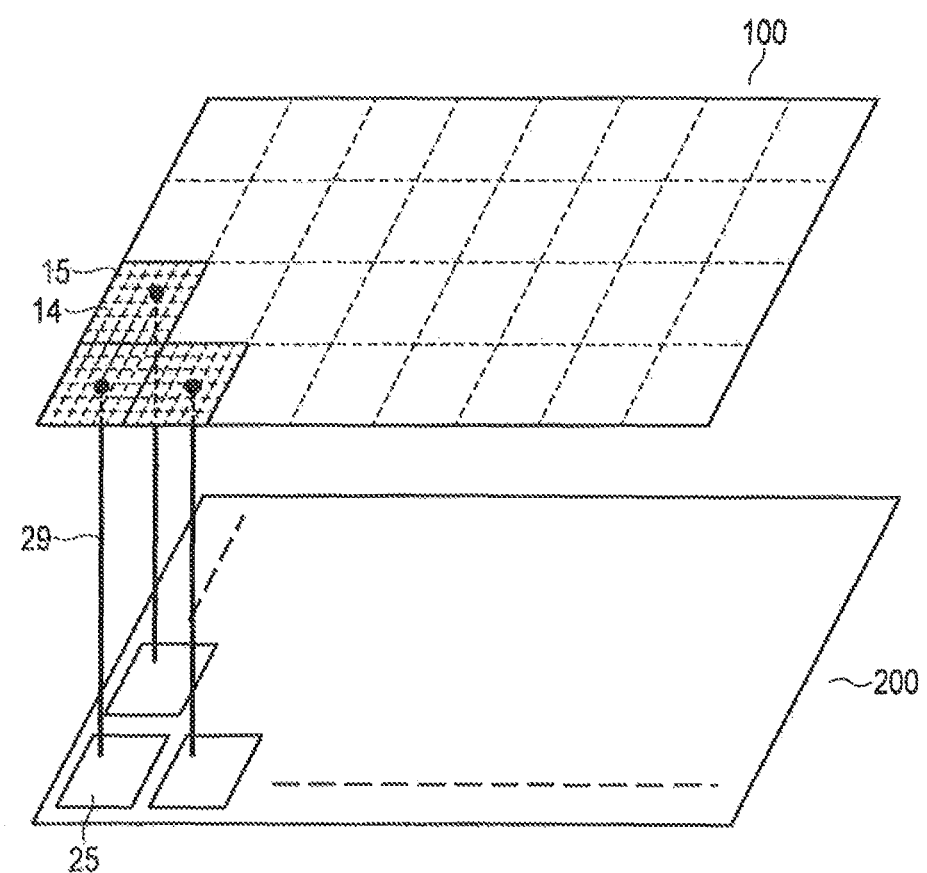
FIG. 1 is a schematic diagram illustrating a basic configuration of an image sensor device according to a first embodiment.

FIG. 1 is a schematic diagram illustrating a basic configuration of an image sensor device according to a first embodiment.

A reference numeral 100 in FIG. 1 denotes a pixel array 100 of a backside illumination type CIS. The array 100 is formed by arranging backside illumination type pixels 14, each of which is formed of a photodiode and a MOS transistor, in a matrix form. M×N pixels 14 form a block 15, and n×m blocks 15 are arranged in the array 100.

An ACD array 200 is disposed on the pixel array 100 so that the ADC array 200 is opposed to the frontside face side (the lower side in FIG. 1, in which light is made incident from above) of the pixel array 100. The ADC array 200 has a structure in which a plurality of ADC cells 25 are arranged so that the ADC cells 25 correspond to the respective blocks 15 of the pixel array 100. An input end of each of the ADC cells 25 is connected by an interlayer via 29 to an output end of the block 15 corresponding to the cell 25.

Although the schematic diagram of FIG. 1 illustrates that the pixel array 100 is distant from the ADC array 200, actually the pixel array 100 is adjacent to the ADC 200, and the ADC array 200 is stacked on the pixel array 100 via an interlayer insulating film (not illustrated). The interlayer vias 29 are disposed to pierce the interlayer insulating film.

Figure 2:
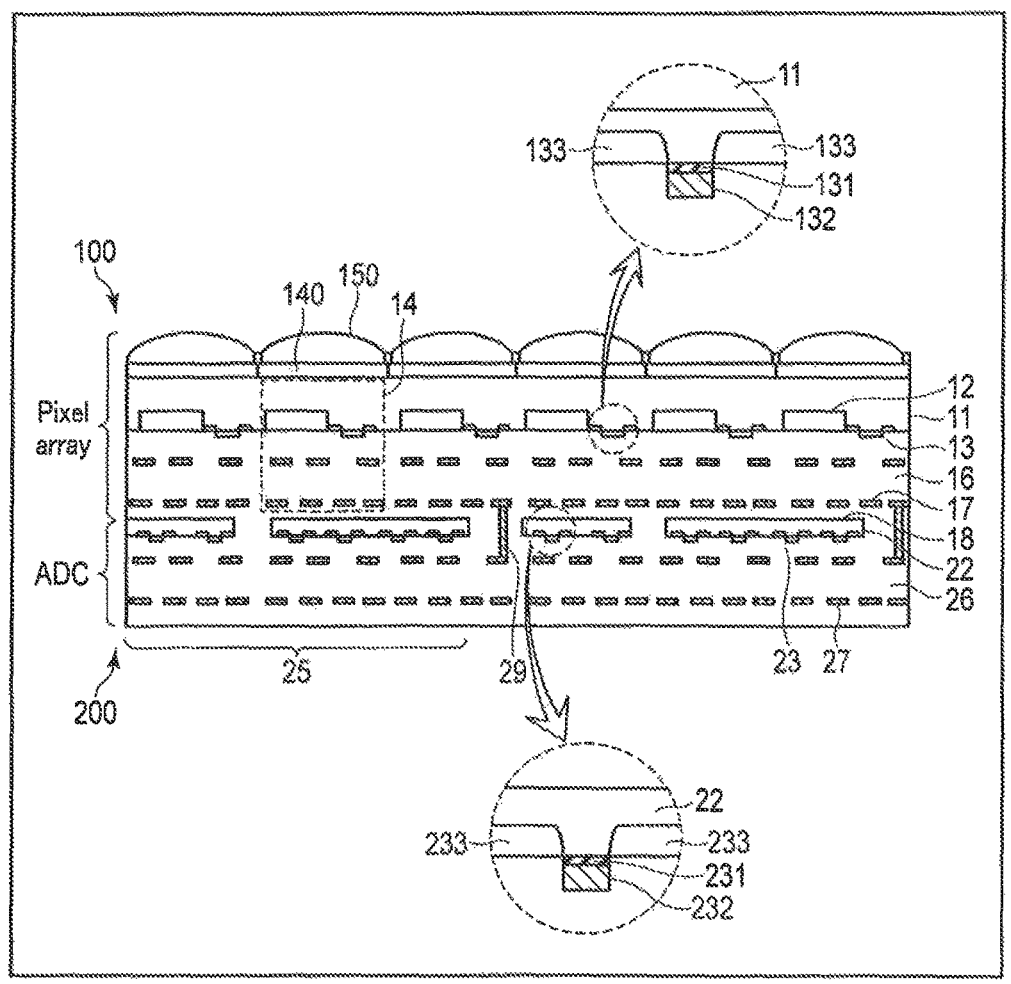
FIG. 2 is a cross-sectional view illustrating a device configuration of the image sensor device according to the first embodiment.

FIG. 2 is a cross-sectional view illustrating a device configuration of the present embodiment.

A number of backside illumination type photo-detecting cells 14, each of which is formed of a photodiode 12 and a MOS transistor 13, are arranged on a Si substrate 11. An interlayer insulating film 16 and interconnects 17 are stacked on upper portions of the photo-detecting cells 14, to form the pixel array 100. Each of the MOS transistors 13 is formed by disposing a gate electrode 132 on the Si substrate 11 via a gate insulating film 131, and disposing source/drain regions 133 in the Si substrate 11 on both sides of the gate electrode 132. Although FIG. 2 illustrates only one MOS transistor 13 in each pixel, actually each pixel (cell) is disposed with a reading transistor, a selection transistor, an amplifying transistor, and a reset transistor, etc. to form the pixel portion of the CIS. Because a specific circuit configuration thereof is well known to those skilled in the art, a detailed explanation of the pixel portion of the CIS is omitted here.

A polycrystalline SiGeSn film (semiconductor thin film) 22 is formed on the pixel array 100 via an interlayer insulating film 18. Thin-film transistors (MOS transistors) 23 are formed on the polycrystalline thin film 22, each of thin-film transistor includes a gate insulating film 231, a gate electrode 232, and source/drain regions 233. The source/drain regions 233 and the gate electrodes 232 of a plurality of MOS transistors 23 are connected by metal interconnects 27 via an interlayer insulating film 26. With this structure, an ADC cell (ADC circuit) 25 is formed. The ADC array 200 is formed by arranging a plurality of ADC cells 25 in a parallel manner. For example, each block of 8×8 pixels in the pixel array 100 is electrically connected to one ADC cell 25 with a via interconnect 29.

The thickness of the active layer of the SiGeSn transistor 23, that is, the thickness of the SiGeSn semiconductor thin film 22, is preferably ¼ or less the gate length, to obtain favorable off properties. Specifically, a thickness of 10 nm to 50 nm is preferable as the thickness of the SiGeSn semiconductor thin film. The Si composition of the SiGeSn semiconductor thin film 22 is preferably 20% or more, to reduce the off current to a level equal to that of an ordinary Si-CMOS by securing a bandgap equal to that of Si. The SiGeSn semiconductor thin film 22 preferably has a higher Sn composition, to achieve a sufficiently low (400° C. or less) process temperature that does not damage the metal interconnects of the pixel array 100. By contrast, when Sn composition of the SiGeSn semiconductor thin film, 22 is too high, during crystallization Sn segregates as metal Sn inside the crystal. For this reason, the preferable Sn composition thereof is 0.5% to 2%. However, when a high off current does not cause any problems in design, Ge should be used to enjoy the advantage of mobility.

Figure 3:
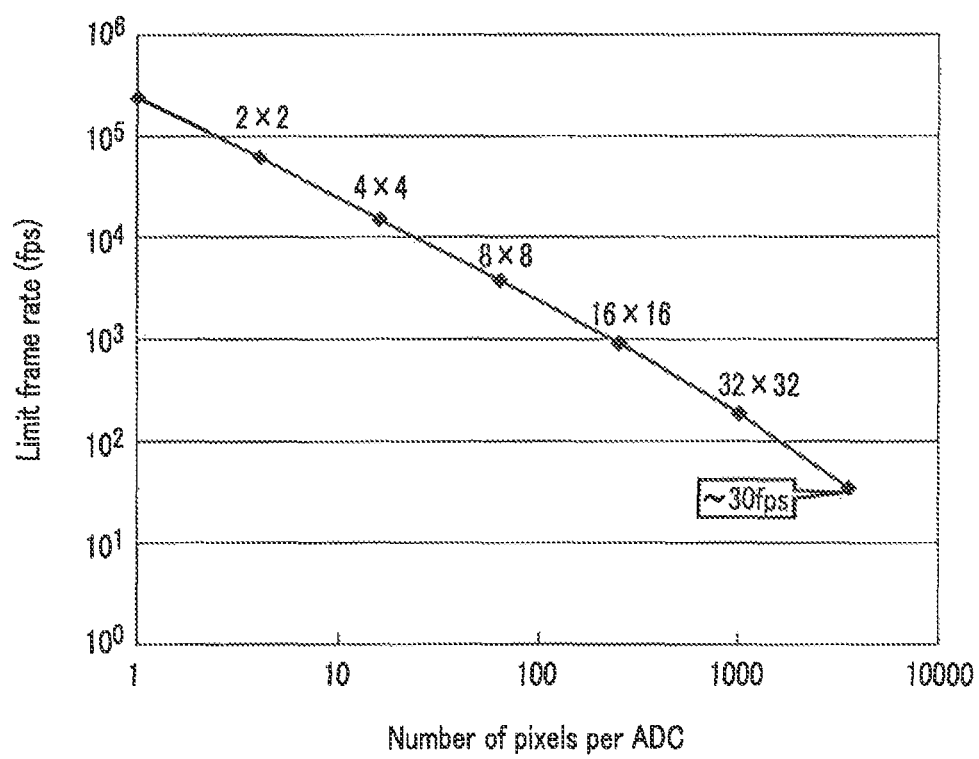
FIG. 3 is a characteristic diagram illustrating a relationship between the number of pixels per one ADC and the limit frame rate.

The present embodiment also enables further shortening of the processing time per frame as the number of pixels controlled by one ADC cell 25 decreases. Specifically, the present embodiment improves the frame rate of the image sensor device. FIG. 3 illustrates calculation results thereof. Although a conventional column parallel type ADC exhibits performance of 30 fps, the present embodiment produces performance of 1000 fps with a 16×16 pixel block, and performance exceeding 10000 fps with a 4×4 pixel block.

Figure 4:
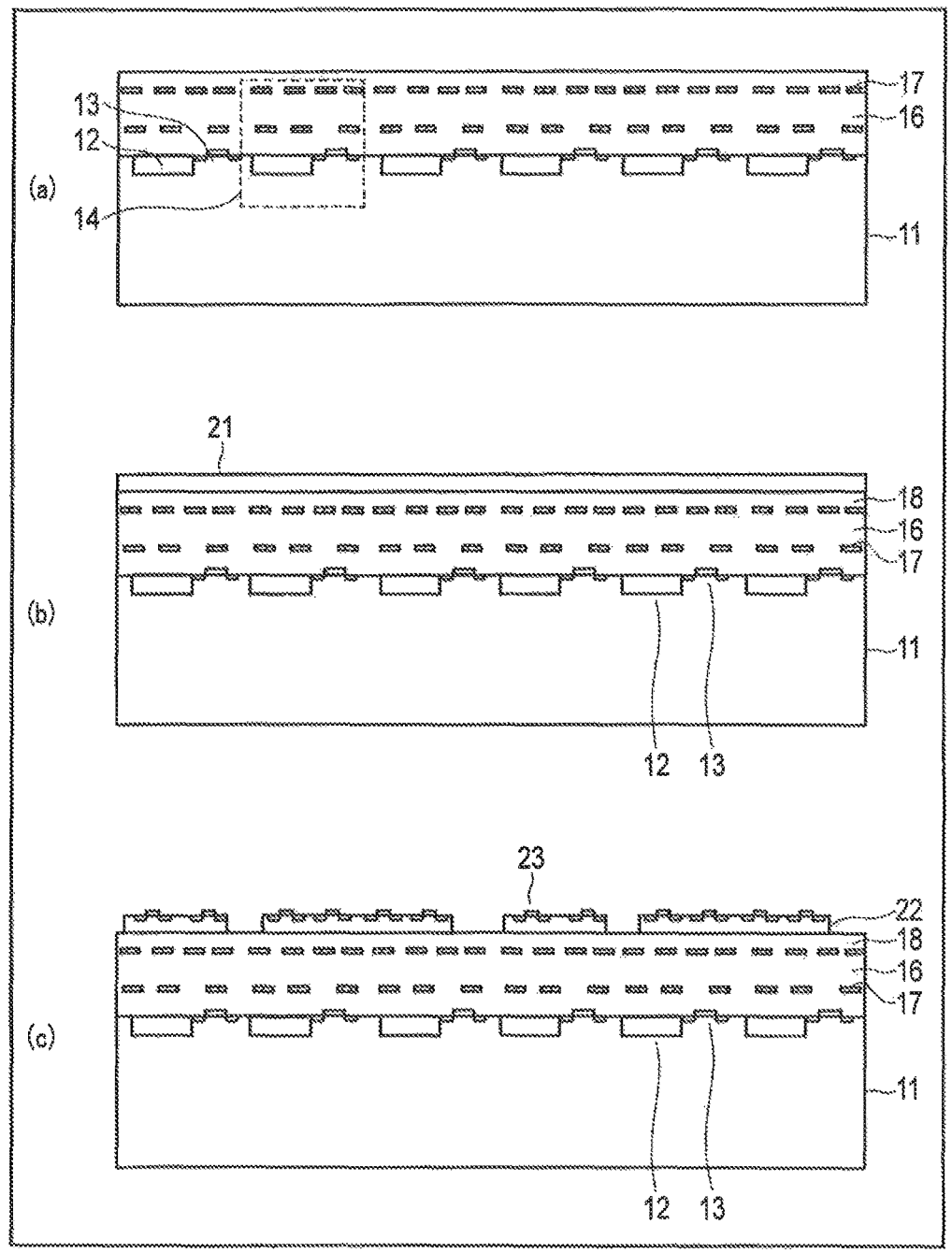
FIG. 4 is a. cross-sectional view illustrating a manufacturing process of the image sensor device according to the first embodiment.
Figure 5:
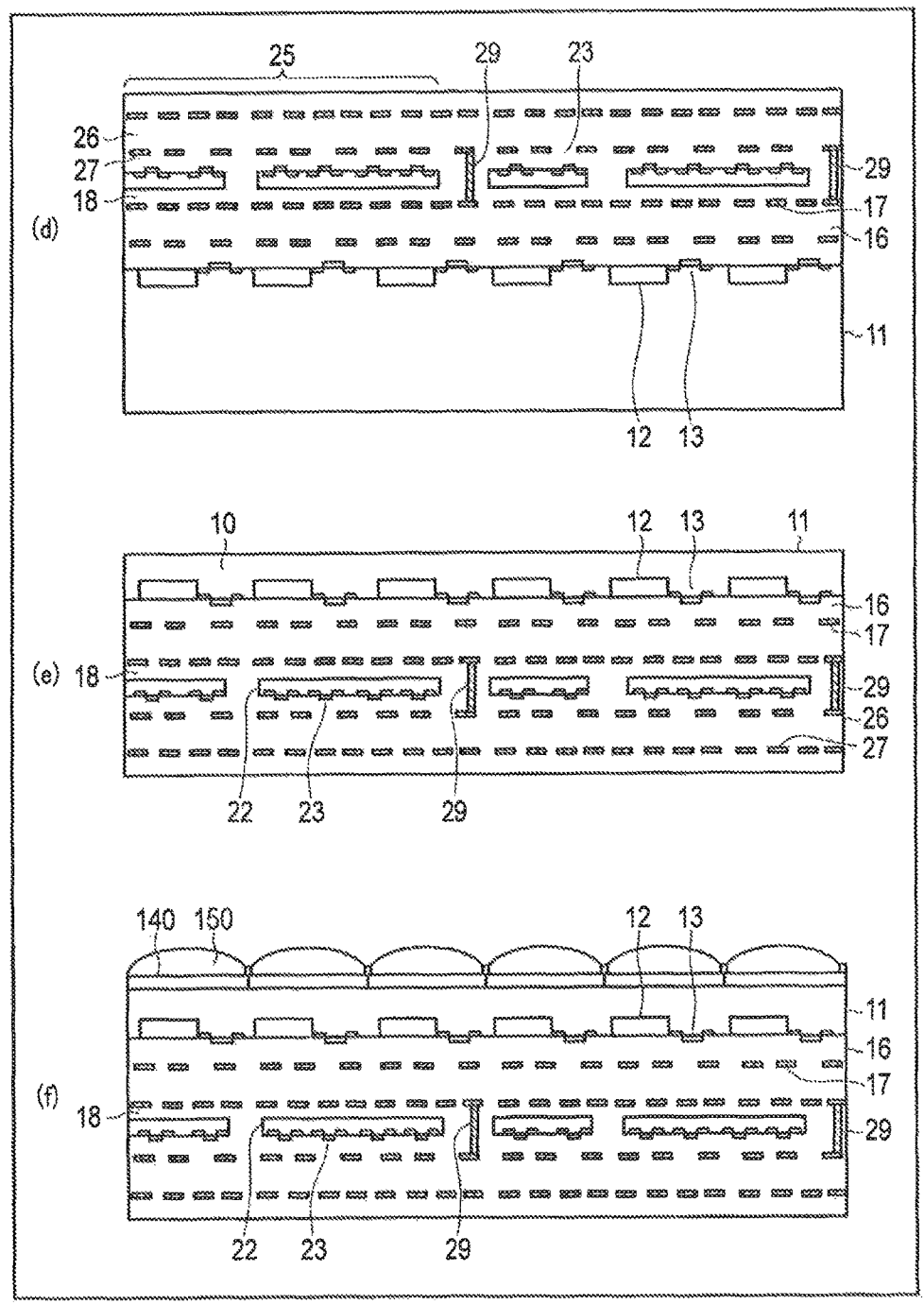
FIG. 5 is a cross-sectional view illustrating the manufacturing process of the image sensor device according to the first embodiment.

The following is an explanation of a method for manufacturing the image sensor device according to the present embodiment, with reference to FIG. 4 and FIG. 5.

First, as illustrated in (a) of FIG. 4, pixels 14 are formed on the Si substrate 11 by a known method so that the pixels 14, each of which includes a photodiode 12 and a MOS transistor 13, are arranged in a matrix form. Thereafter, an interlayer insulating film 16 and interconnects 17 are formed on the pixels 14. In this manner, the pixel array 100 is formed.

Thereafter, as illustrated in (b) of FIG. 4, an interlayer insulating film 18 is formed on the pixel array 100, and thereafter an amorphous SiGeSn film 21 is deposited on the interlayer insulating film 18. The amorphous SiGeSn film 21 is deposited by sputtering, vacuum deposition, CVD, or the like. A polycrystalline SiGeSn film may be directly formed by CVD or the like.

Thereafter, as illustrated in (c) of FIG. 4, after a device isolation step by mesa isolation for the amorphous SiGeSn film, a poly-SiGeSn film (active region) 22 is formed by annealing in a nitrogen gas with a temperature range of 250° C. to 400° C. No annealing is required in the case where a polycrystalline semiconductor thin film is formed in the previous step. Thereafter, thin-film transistors 23 are formed on the SiGeSn film 22 through steps such as gate stack formation, gate processing, source/drain formation, and the like.

Next, as illustrated in (d) of FIG. 5, an interlayer insulating film 26 and interconnects 27 are formed on the thin-film transistors 23, to form an ADC array 200 including a plurality of ADC cells 25 corresponding to blocks. In addition, the interconnects 17 on the pixel array 100 side are connected with the interconnects 27 on the ADC array 200 side with interlayer vias 29.

Thereafter, as illustrated in (e) of FIG. 5, the backside face of the Si substrate 11 is polished to reduce the thickness of the Si substrate 11.

Lastly, as illustrated in (f) of FIG. 5, red, green, and blue color filters 140 and micro lenses 150 are formed on the backside face side of the Si substrate 11, to finish the image sensor device.

As described above, according to the present embodiment, the ADC array 200 formed of SiGeSn transistors are formed on the backside illumination type pixel array 100 via the interlayer insulating film 18, without using microbumps or the like. In addition, the structure of the present embodiment is formed all together by a CMOS manufacturing process that is commonly used. An ADC cell 25 is electrically connected to a pixel block of N×M dots through the interlayer via 29. In addition, because SiGeSn channels are used for the transistors of the ADC cells 25, a transistor formation process can be performed under the condition of a low temperature (400° C. or less) that does not cause thermal damage to the metal interconnects or the like in the underlayer pixel chip.

In addition, because an electrical connection between the pixel block 15 and the ADC cell 25 in the present embodiment is formed by an ordinary CMOS interconnection process, the present embodiment enables connections having high accuracy and high density, in comparison with prior art of connecting a plurality of chips with TSVs or microbumps. For this reason, the present embodiment can be compatible with small-sized CISs having a narrow pixel pitch that are not compatible with TSVs or microbumps. The present embodiment also eliminates the costs for dicing, alignment, bonding to bond chips, and the like, thus achieving cost reduction.

Accordingly, with the number of pixels further increasing in the future, the present embodiment is very effective for materializing small-sized CMOS image sensors, digital cameras, monitoring cameras, medical cameras, and sensor networks, etc.

Second Embodiment

Figure 6:
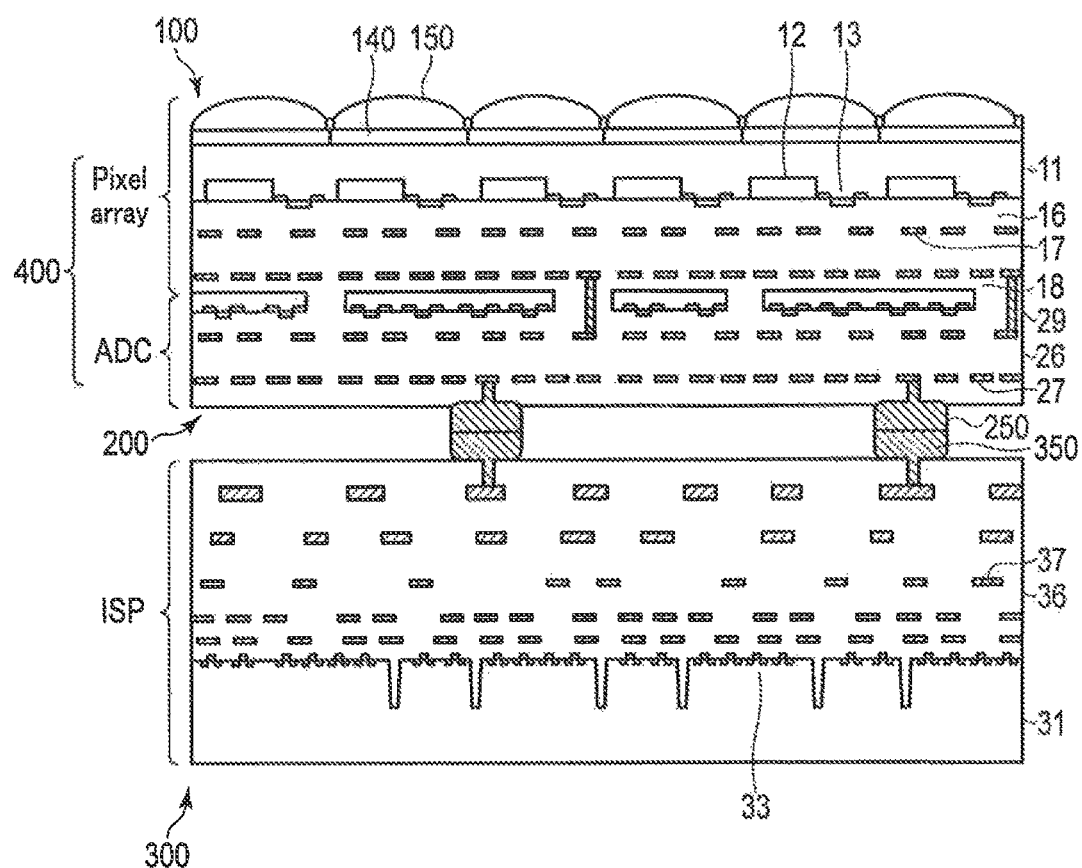
FIG. 6 is a cross-sectional view illustrating a device configuration of an image sensor device according to a second embodiment.

FIG. 6 is a cross-sectional view illustrating a device configuration of an image sensor device according to a second embodiment. The constituent elements similar to those in FIG. 2 will be denoted by the same reference numerals, and detailed descriptions thereof will be omitted.

The present embodiment is an application example of the first embodiment. The present embodiment is different from the first embodiment described above in that a CIS chip 400 including a pixel array 100 and an ADC array 200 as in the first embodiment is mounted on an image processing LSI chip 300. Specifically, in the present embodiment, an image processing LSI chip 300 manufactured by an advanced CMOS process is prepared separately from the CIS chip 400. The image processing LSI chip 300 is formed by forming MOS transistors 33 on an Si substrate 31, and forming an interlayer insulating film 36 and interconnects 37 on the Si substrate 31 and the MOS transistors 33. Microbumps 350 are formed on an uppermost face of the image processing LSI chip 300.

By contrast, microbumps 250 are formed on an uppermost face of the CIS chip 400. The CIS chip 400 is mounted on the LSI chip 300, and the microbumps 250 are joined to the microbumps 350, to unite the CIS chip 400 with the LSI chip 300. In this manner, the image sensor device with an image processing circuit according to the present embodiment is formed.

As described above, according to the present embodiment, the ADC array 200 is stacked on the pixel array 100 via the interlayer insulating film 18, and the chips are connected through interlayer vias 29. This structure produces the same effect as that of the first embodiment described above, and also produces the following effect. Specifically, the CIS chip 400, being a stacked structure of the pixel array 100 and the ADC array 200, is mounted on the image processing LSI chip 300, and the chips 100, 200, and 300 are connected by the microbumps 250 and 350. With this structure, the present embodiment enables transmission of signals detected by the pixel array 100 and subjected to analog-digital conversion by the ADC array 200 to the image processing LSI chip 300 via the microbumps 250 and 350.

Accordingly, the present embodiment enables integration of the three functions of image processing, ADC, and an image sensor array into one chip, and enables further miniaturization of the image sensor device with an image processing circuit. The present embodiment also enables transmission of signals from the ADC in a parallel manner to the image processing chip via the microbumps, and thereby enhances the processing speed of the image sensor device by also parallelizing image processing. Specifically, the present embodiment enables substantial improvement in performance of the whole image input/image processing system by parallelizing processing from retrieval of signals from PDs (photodiodes) to image processing all together.

Third Embodiment

Figure 7:
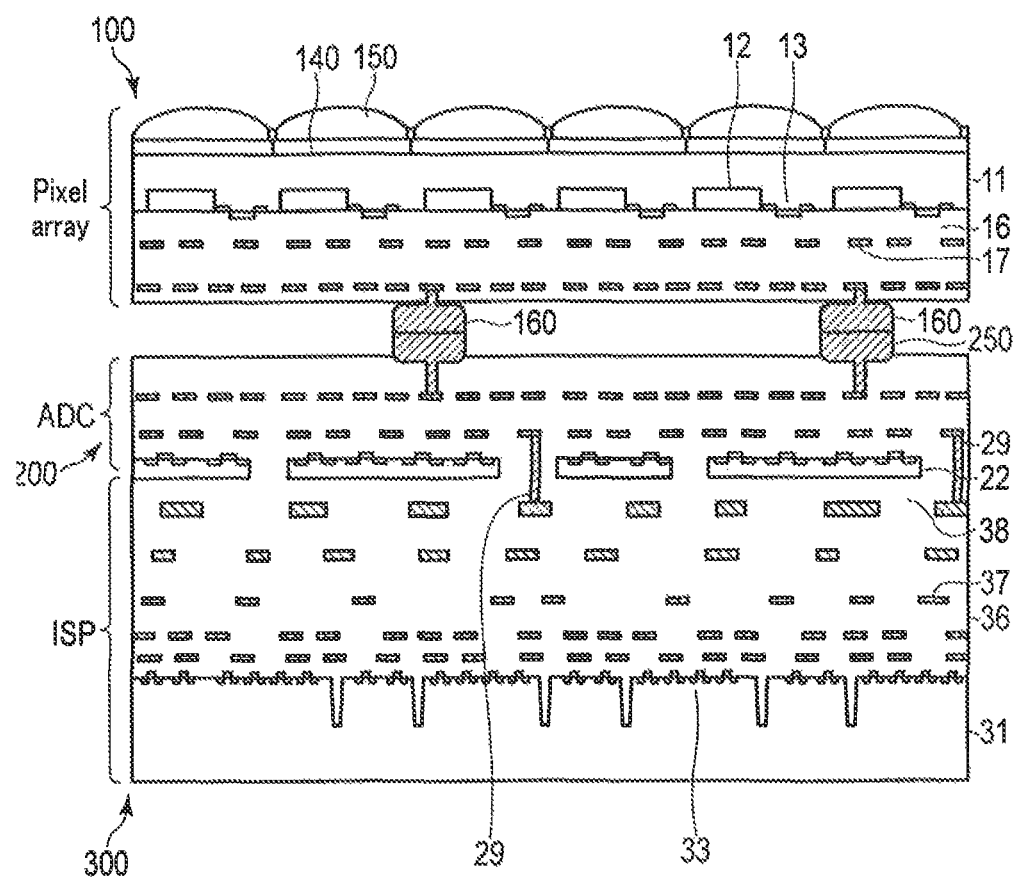
FIG. 7 is a cross-sectional view illustrating a device configuration of an image sensor device according to a third embodiment.

FIG. 7 is a cross-sectional view illustrating a device configuration of an image sensor device according to a third embodiment. The constituent elements similar to those in FIG. 2 will be denoted by the same reference numerals, and a detailed description thereof will be omitted.

The present embodiment is different from the second embodiment described above in that an ADC array 200 is stacked on an image processing LSI chip 300, not a pixel array 100.

The ADC array 200 is formed on the image processing LSI chip 300 via an interlayer insulating film 38, and the ADC array 200 is connected to the image processing LSI chip 300 through interlayer vias 29. In addition, input terminals of respective ADC cells 25 are connected to microbumps 250 disposed on an outermost face of the ADC chip. The pixel array 100 is connected in each of 8×8 pixel blocks, for example, and some interconnects thereof are connected to microbumps 160. The microbumps 160 of the pixel array 100 are mutually connected to the microbumps 250 of the ADC-stacked image processing LSI chip 300 to unite the pixel array 100 with the ADC-stacked image processing LSI chip 300.

The structure of the present embodiment enables less of an increase in density of the ADCs than in the first embodiment, because the size of each pixel block is limited due to the limitations of the alignment accuracy between the size of the pixel blocks and the size of the microbumps. However, like the structure of FIG. 6, the present embodiment enables integration of the three functions of image processing, ADC, and an image sensor array into one chip. The present embodiment also enables transmission of signals from the ADCs in a parallel manner to the image processing chip through the interlayer vias, and thereby enhances the processing speed of the image sensor device by also parallelizing image processing. Specifically, the present embodiment enables substantial improvement in performance of the entire image input/image processing system by batch parallelizing processing from retrieval of signals from Pas (photodiodes) to image processing.

Modification

The present embodiment is not limited to the embodiments described above.

The embodiments illustrate the structure of using SiGeSn as a semiconductor thin film for forming an ADC array, but the embodiments are not limited thereto. In the present embodiment, another material may be used for the semiconductor thin film for forming the ADC array, as long as the material enables formation of a crystal layer with a good quality at a lower temperature than that for Si. For example, the semiconductor thin film for forming the ADC array may be monocrystalline or polycrystalline Ge, or monocrystalline or polycrystalline Ge to which at least one of Si and Sn is added.

The heat treatment to polycrystallize (or monocrystallize) the amorphous SiGeSn or amorphous Ge film is not limited to annealing in a nitrogen gas atmosphere at 400° C. or less, but may be heat treatment in another atmosphere; for example, an atmosphere including at least one of hydrogen, helium, and oxygen, or including a mixture gas thereof. The amorphous SiGeSn or amorphous Ge film may be crystallized by light irradiation with an intensity sufficient to instantaneously melt part of the amorphous layer, such as laser annealing. In this case, it is preferable to select the pulse width and the light intensity that does not cause thermal damage to the pixels of the underlayer.

The configuration of the photo-detecting elements (pixels) is not limited, as long as the photo-detecting sensors (pixel array) including the photo-detecting elements are of a backside illumination type. The configuration of the CMOS circuits forming the photo-detecting elements may be properly changed according to the specifications of the image sensor device. In addition, the number of pixels forming a block is not at all limited to the number explained in the embodiments, but may be properly changed according to the specifications of the image sensor device.

In addition, each ADC may have a structure in which an ADC is equipped with another additional function, such as an analog memory (MISCAP, MIMCAP) and a switch transistor thereof for a global shutter.

As described above, according to the present embodiment, analog/digital converting circuits are formed all together by a CMOS process on a semiconductor thin film formed on a sensor array via an interlayer insulating film. With this structure, the present embodiment enables stacking of a sensor array and ADCs, without forming the pixel portion of the CIS and the circuit portion of the ADCs with separate chips, or bonding the chips.

The present embodiment can reduce the pitch of connecting the pixel portion and the ADCs to the limit of the microbumps or less, can be dealing with a CIS having minute pixels with a pixel pitch of approximately 1 μm, for example. According to the present embodiment, the interconnection pitch can be set to achieve high density without being restricted by the limit of the pitch of the microbumps.

With this structure, the present embodiment enables a reduction in manufacturing costs, together with a reduction in chip area and improvement in processing performance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image sensor device comprising:
a sensor array disposed on a semiconductor substrate, the sensor array including blocks, each of the blocks including at least one pixel and outputting a signal of the at least one pixel;
a first insulating layer disposed on the sensor array;
semiconductor layers disposed on the first insulating layer;
analog-digital converting circuits disposed on the semiconductor layers, the analog-digital converting circuits corresponding to the blocks and processing the signal;
a second insulating layer disposed on the first insulating layer and the analog-digital converting circuits; and
interconnect portions electrically connecting the analog-digital converting circuits to the blocks via a region between the semiconductor layers, the interconnect portions extending across the first insulating layer and the second insulating layer.

2. The device according to claim 1, wherein
the each of the blocks includes M×N pixels (M and N are integers), and
the analog-digital converting circuits correspond to the blocks respectively.

3. The device according to claim 1, wherein
the semiconductor substrate is a monocrystalline substrate, and
the semiconductor layers are monocrystalline layers or polycrystalline layers.

4. The device according to claim 1, wherein
the semiconductor layers include at least Si and Sn, and
the semiconductor layers have a Si composition of 20% or more and a Sn composition of 2% or less.

5. The device according to claim 4, wherein
the semiconductor layers further include Ge, and
the semiconductor layers are mixed crystal layers.

6. The device according to claim 1, further comprising:
a lens array disposed on a side of a first face of the semiconductor substrate,
wherein
the analog-digital converting circuits are disposed on a side of a second face of the semiconductor substrate, and
the second face is opposed to the first face.

7. An image processing device comprising:
the image sensor device according to claim 1; and
a processor for image processing, the processor having a face on which bumps are disposed,
wherein the analog-digital converting circuits are electrically connected to the bumps.

8. An image sensor device comprising;
a sensor array disposed on a first semiconductor substrate, the sensor array including blocks, each of the blocks including at least one pixel and outputting a signal of the at least one pixel;
first bumps disposed on the first semiconductor substrate and connected to an output end of the each of the blocks;
an image processing circuit disposed on a second semiconductor substrate;
an first insulating layer disposed on the image processing circuit;
semiconductor layers disposed on the first insulating layer;
analog-digital converting circuits disposed on the semiconductor layers, the analog-digital converting circuits corresponding to the blocks and processing the signal;
a second insulating layer disposed on the first insulating layer and the analog-digital converting circuits;
interconnect portions electrically connecting the analog-digital converting circuit to the image processing circuit via a region between the semiconductor layers, the interconnect portions extending across the first insulating layer and the second insulating layer; and
second bumps connected to an input end of each of the analog-digital converting circuits, the second bumps being connected to the first bumps.

9. The device according to claim 8, wherein
the each of the blocks includes M×N pixels (M and N are integers), and
the analog-digital converting circuits correspond to the blocks respectively.

10. The device according to claim 8, wherein
the first and second semiconductor substrates are monocrystalline substrates, and
the semiconductor layers are monocrystalline layers or polycrystalline layers.

11. The device according to claim 8, wherein
the semiconductor layers include at least Si and Sn, and
the semiconductor layers have a Si composition of 20% or more and a Sn composition of 2% or less.

12. The device according to claim 11, wherein
the semiconductor layers further includes Ge, and
the semiconductor layers are mixed crystal layers.

13. The device according to claim 8, further comprising:
a lens array disposed on a side of a first face of the semiconductor substrate,
wherein
the analog-digital converting circuits are disposed on a side of a second face of the semiconductor substrate, and
the second face is opposed to the first face.

14. A method for manufacturing an image sensor device comprising:
forming a sensor array on a semiconductor substrate, the sensor array including blocks, each of blocks including at least one pixel and outputting a signal of the at least one pixel;
forming a first insulating layer on the sensor array;
forming semiconductor layers on the first insulating layer;
forming analog-digital converting circuits on the semiconductor layers, the analog-digital converting circuits corresponding to the blocks and processing the signal;
forming a second insulating layer on the first insulating layer and the analog-digital converting circuits; and
forming interconnect portions across the first insulating layer and the second insulating layer to electrically connect the analog-digital converting circuits to the blocks via a region between the semiconductor layers.

15. The method according to claim 14, wherein
the semiconductor substrate is a monocrystalline substrate, and
the semiconductor layers are monocrystalline layers or polycrystalline layers.

16. The method according to claim 14, wherein
the semiconductor layers include at least Si and Sn, and
the semiconductor layers have a Si composition of 20% or more and a Sn composition of 2% or less.

17. The method according to claim 16, wherein
the semiconductor layers further includes Ge, and
the semiconductor layers are mixed crystal layers.

18. The method according to claim 14, wherein
a temperature range for forming of the semiconductor layers is from 250° C. to 400° C.

19. The method according to claim 14, wherein
the forming of the semiconductor layers includes:
forming a layer selected from the group consisting of an amorphous Si layer, an amorphous Ge layer, an amorphous SiGe layer, an amorphous GeSn layer, an amorphous SiGeSn layer, or a stacked layer thereof.
dividing the layer into a plurality of layers, and
performing thermal treatment to crystallize the plurality of layers, the thermal treatment having a temperature range from 250° C. to 400° C.

20. The method according to claim 14, further comprising:
forming a lens array on a side of a first face of the semiconductor substrate, the first face being opposed to a second face of the semiconductor substrate,
wherein the analog-digital converting circuits are formed on a side of the second face.

* * * * *